US008624372B2

(12) United States Patent
Hetzel et al.

(10) Patent No.: US 8,624,372 B2
(45) Date of Patent: Jan. 7, 2014

(54) SEMICONDUCTOR COMPONENT COMPRISING AN INTERPOSER SUBSTRATE

(75) Inventors: Wolfgang Hetzel, Nattheim (DE); Jochen Thomas, Munich (DE); Peter Weitz, Sauerlach (DE); Ingo Wennemuth, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/466,279

(22) Filed: Aug. 22, 2006

(65) Prior Publication Data

US 2007/0040261 A1    Feb. 22, 2007

Related U.S. Application Data

(63) Continuation of application No. PCT/DE2005/000302, filed on Feb. 22, 2005.

(30) Foreign Application Priority Data

Feb. 23, 2004 (DE) .......................... 10 2004 009 056

(51) Int. Cl.
*H01L 23/02* (2006.01)
(52) U.S. Cl.
USPC .................. 257/686; 257/787; 257/E23.132; 257/E23.133
(58) Field of Classification Search
USPC .......... 257/686, E25.023, 790, 738, E23.024, 257/E23.129, E23.133, E23.132, 777, 787
See application file for complete search history.

(56) References Cited

U.S. PATENT DOCUMENTS

| | | | | |
|---|---|---|---|---|
| 5,198,888 A * | 3/1993 | Sugano et al. | ................ | 257/686 |
| 5,384,689 A * | 1/1995 | Shen | .............................. | 361/761 |
| 5,668,405 A * | 9/1997 | Yamashita | ..................... | 257/668 |
| 5,677,566 A * | 10/1997 | King et al. | ..................... | 257/666 |
| 5,956,233 A | 9/1999 | Yew et al. | ..................... | 361/760 |
| 6,013,948 A * | 1/2000 | Akram et al. | ................. | 257/698 |
| 6,072,233 A * | 6/2000 | Corisis et al. | ................. | 257/686 |
| 6,207,478 B1 | 3/2001 | Chung et al. | .................. | 438/124 |
| 6,232,152 B1 | 5/2001 | DiStefano et al. | ........... | 438/124 |
| 6,278,616 B1 * | 8/2001 | Gelsomini et al. | ........... | 361/803 |
| 6,303,997 B1 * | 10/2001 | Lee | ................ | 257/778 |
| 6,331,939 B1 | 12/2001 | Corisis et al. | ................. | 361/784 |

(Continued)

FOREIGN PATENT DOCUMENTS

| | | | | |
|---|---|---|---|---|
| DE | 10138278 | 8/2001 | .............. | H01L 23/50 |
| JP | 08153830 | 11/1996 | .............. | H01L 23/28 |

OTHER PUBLICATIONS

International Search Report; PCT/DE2005/000302; pp. 9, Feb. 22, 2005.

*Primary Examiner* — Wael Fahmy
*Assistant Examiner* — Sarah Salerno
(74) *Attorney, Agent, or Firm* — Banner & Witcoff, Ltd.

(57) ABSTRACT

A semiconductor component (10) has an interposer substrate (1) as stack element of a semiconductor component stack (25). The interposer substrate (1) has, on one of the interposer substrate sides (2, 4), a semiconductor chip protected by plastics composition (12) in its side edges (22). An interposer structure (3) partly covered by a plastics composition (12) is arranged on the interposer side (2, 4) opposite to the semiconductor chip (6). Edge regions (11) of the interposer substrate (1) remain free of any plastics composition (12) and have, on both interposer sides (2, 4) external contact pads (7) which are electrically connected to one another via through contacts (8).

19 Claims, 7 Drawing Sheets

(56) References Cited

U.S. PATENT DOCUMENTS

| | | | |
|---|---|---|---|
| 6,400,574 B1 | 6/2002 | Stephenson et al. | 361/760 |
| 6,507,098 B1 * | 1/2003 | Lo et al. | 257/686 |
| 6,522,018 B1 * | 2/2003 | Tay et al. | 257/780 |
| 6,528,722 B2 | 3/2003 | Huang et al. | 174/52.2 |
| 6,686,656 B1 * | 2/2004 | Koh et al. | 257/686 |
| 7,265,441 B2 * | 9/2007 | Reiss et al. | 257/685 |
| 2002/0079578 A1 * | 6/2002 | Matsuura | 257/738 |
| 2002/0135057 A1 * | 9/2002 | Kurita | 257/685 |
| 2002/0173070 A1 | 11/2002 | Bolken et al. | |
| 2003/0006496 A1 | 1/2003 | Vaiyapuri | 257/686 |
| 2003/0030143 A1 * | 2/2003 | Wennemuth et al. | 257/738 |
| 2003/0042564 A1 | 3/2003 | Taniguchi et al. | 257/438 |
| 2003/0052399 A1 * | 3/2003 | Shibata | 257/686 |
| 2003/0067064 A1 * | 4/2003 | Kim | 257/686 |
| 2003/0107118 A1 * | 6/2003 | Pflughaupt et al. | 257/686 |
| 2004/0036164 A1 | 2/2004 | Koike et al. | 257/723 |
| 2004/0038447 A1 * | 2/2004 | Corisis et al. | 438/106 |
| 2004/0159954 A1 * | 8/2004 | Hetzel et al. | 257/777 |
| 2004/0262733 A1 * | 12/2004 | Kumamoto | 257/686 |
| 2005/0012195 A1 * | 1/2005 | Go et al. | 257/686 |

\* cited by examiner

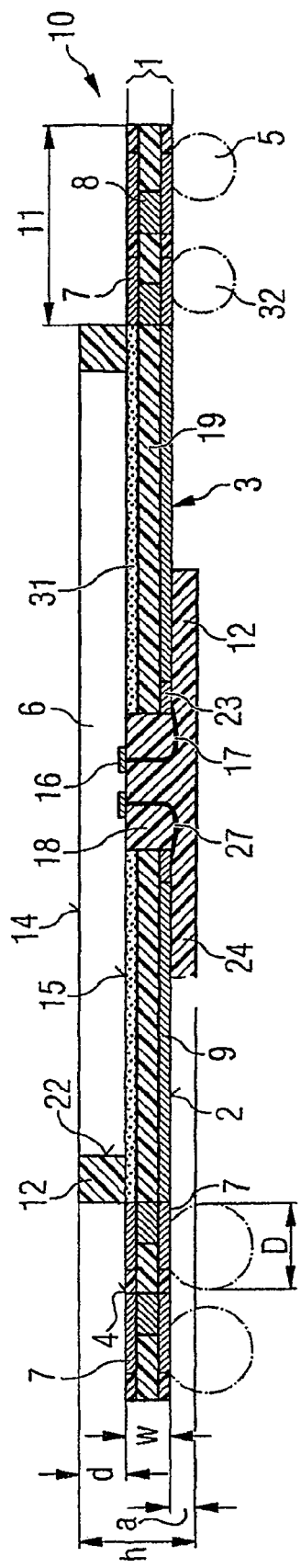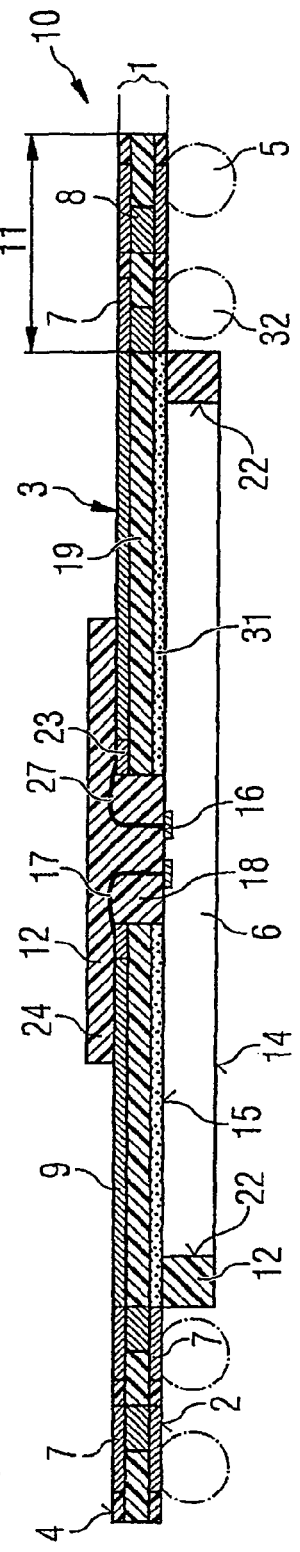

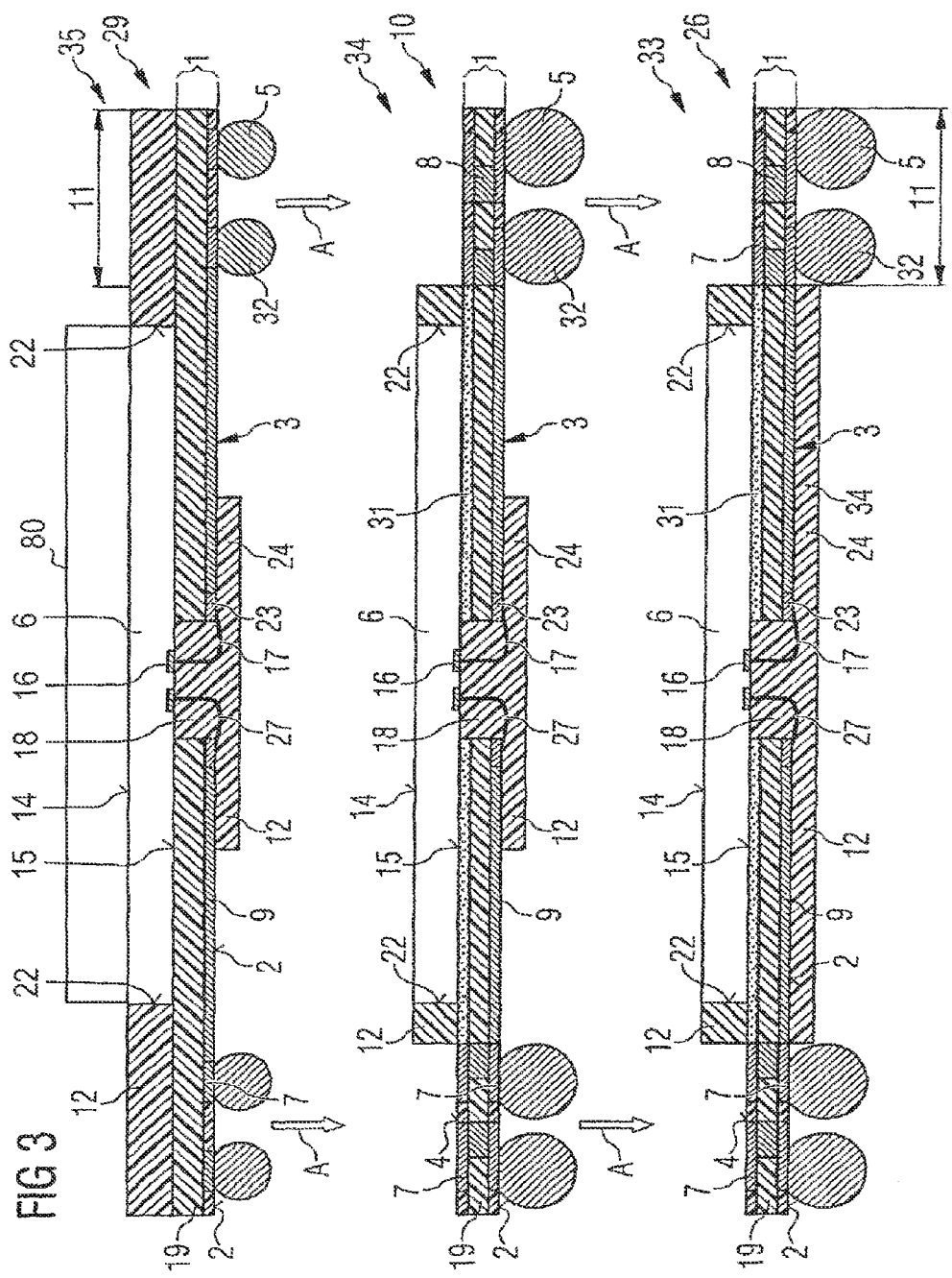

SEMICONDUCTOR COMPONENT COMPRISING AN INTERPOSER SUBSTRATE

CROSS-REFERENCE TO RELATED APPLICATION

This application is a continuation of International Application No. PCT/DE2005/000302, filed Feb. 22, 2005 which designates the United States, and claims priority to German application number DE 10 2004 009 056.4 filed Feb. 23, 2004.

TECHNICAL FIELD

The invention relates to a semiconductor component comprising an interposer substrate; in particular, the invention relates to a component arrangement for stacking semiconductor components comprising an interposer substrate having a top side for a semiconductor component to be stacked and an underside for fitting external contacts.

BACKGROUND

In conventional semiconductor components comprising an interposer substrate, external contacts are arranged on the underside of the interposer substrate, and at least one semiconductor chip, for example a memory component such as a DRAM, is arranged on the top side of the interposer substrate, in the center of the interposer substrate.

If a conventional component of this type is intended to be used as a stackable semiconductor component for a semiconductor module comprising stacked semiconductor components, then only the edge regions of the interposer substrate can be available for fitting external contacts of a stacked semiconductor component, since the center of the interposer substrate is occupied by the semiconductor chip. As a result, the number and arrangement of external contacts of the semiconductor component to be stacked is very restricted, so that a high number of known package types, such as BGA (Ball Grid Array) or LGA (Land Grid Array) packages, cannot be stacked on a conventional semiconductor component comprising an interposer substrate.

One solution to this stacking problem is known from the document DE 101 38 278. For stacking purposes, conventional semiconductor components comprising a BGA or LGA package are provided with additional flexible interposer films which have a larger area than the semiconductor components to be stacked and which project beyond the edge of the semiconductor components, so that they can be bent in the direction of a semiconductor component arranged underneath in a semiconductor component stack and can be electrically connected via the flexible film to the semiconductor component arranged underneath.

A semiconductor module comprising semiconductor components stacked in this way has the disadvantage that the semiconductor components cannot be stacked with the smallest possible space requirement, especially as the bent-away interposer film also may require a bending radius that cannot be undershot without risking microcracks in the interposer lines arranged on the interposer film.

SUMMARY

A semiconductor component may comprise an interposer substrate and a method for the production thereof which can be stacked one on top of another in any desired number in order to form a semiconductor module. This stackable component can be enabled to be combined with differently constructed base components and with differently constructed topmost semiconductor components to form a semiconductor module. Moreover, a semiconductor component may comprise an interposer substrate with which stacking is not restricted to a few predetermined patterns of semiconductor components, but rather in which the arrangement and assignment of connecting external contacts can be varied as desired. Furthermore, the space requirement and the area requirement of a semiconductor module may be minimized, in particular to reduce the space requirement of a memory module comprising DRAM semiconductor components.

A semiconductor component may comprise an interposer substrate as stack element of semiconductor component stacks, the interposer substrate having an underside and a top side, on which are arranged mutually opposite external contact pads in edge regions of the interposer substrate, which are electrically connected via through contacts through the interposer substrate, and which surround a semiconductor chip arranged in the center of the interposer substrate, and contact areas on the active top side of the semiconductor chip being electrically connected via a central bonding channel in the interposer substrate to an interposer structure on the opposite side of the interposer substrate to the semiconductor chip, and the interposer structure having interposer lines extending from the central bonding channel to the external contact pads, the interposer substrate side opposite to the semiconductor chip having a covering made of plastics composition that covers the interposer structure whilst leaving free the edge regions with the external contact pads and the side edges of the semiconductor chip being covered by a plastics composition.

BRIEF DESCRIPTION OF THE DRAWINGS

The invention will now be explained in more detail with reference to the accompanying figures.

FIG. 1 shows a schematic cross section through a semiconductor component, in accordance with a first embodiment;

FIG. 2 shows a schematic cross section through a semiconductor component, in accordance with a second embodiment;

FIG. 3 shows a schematic cross section of three DRAMs aligned with one another, in accordance with the first embodiment;

DETAILED DESCRIPTION

Figure 4:
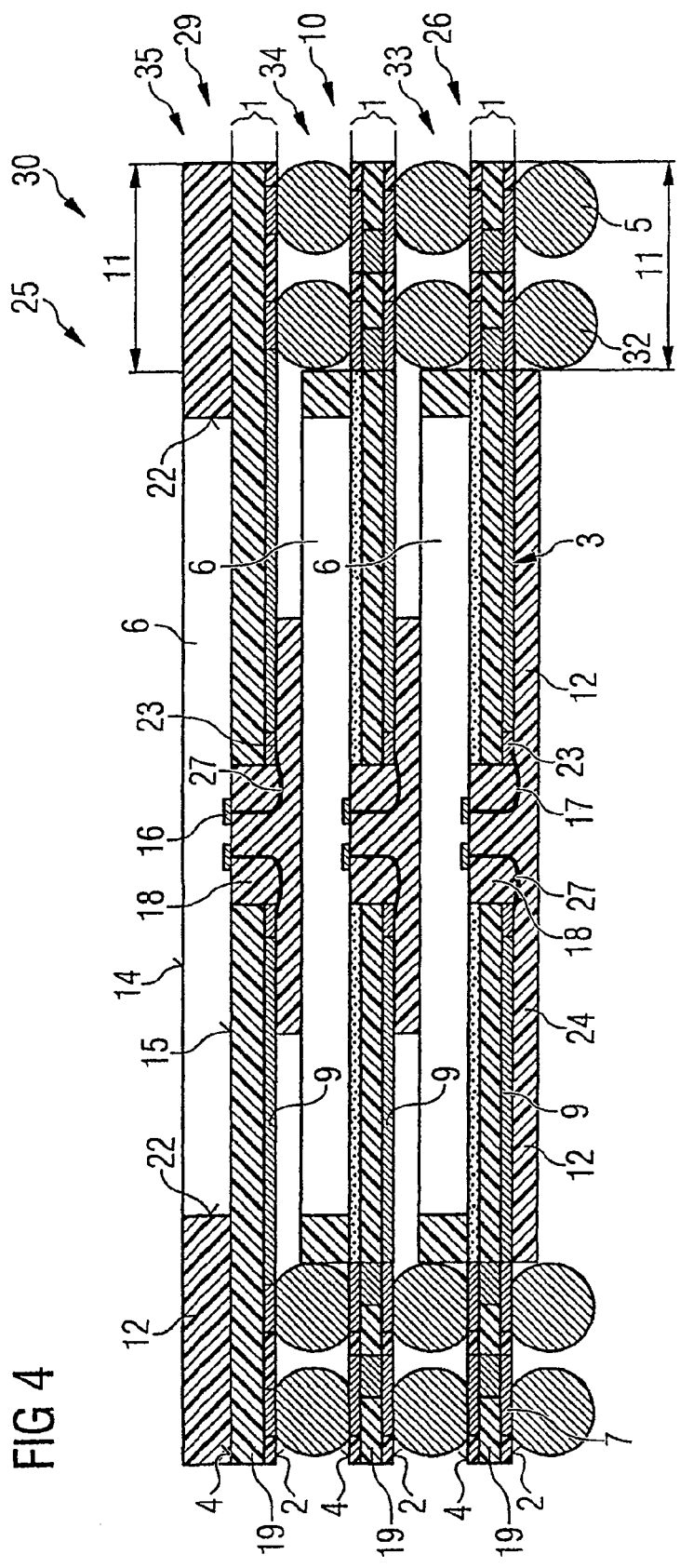
FIG. 4 shows a schematic cross section through a memory module comprising three semiconductor components stacked one on top of another, in accordance with the first embodiment.

A semiconductor component may comprise an interposer substrate as stack element of semiconductor component stacks. The interposer substrate of the semiconductor component may have an underside and a top side. There can be arranged on the top side and on the underside mutually opposite external contact pads in edge regions of the interposer substrate. The mutually opposite external contact pads can be electrically connected to one another via through contacts. The external contact pads may surround a semiconductor chip arranged in the center of the interposer substrate. The semiconductor chip can be arranged with its active top side on one of the interposer sides in such a way that the contact areas of the semiconductor chip which are arranged on the active top side are arranged in a central bonding channel of the interposer substrate. The central bonding channel can be formed by an opening in the center of the interposer substrate. Via bonding connections in the central bonding channel, the contact areas of the semiconductor chip can be connected to an interposer structure on the opposite interposer substrate side.

The interposer structure may have interposer lines extending from the central bonding channel to the external contact pads. The semiconductor chip can be covered by a plastics composition on its side edges whilst leaving free the external contact pads arranged in the edge regions of the interposer substrate. On the interposer side opposite to the semiconductor chip, the interposer structure can be partially covered by a covering made of plastics composition, which simultaneously fills the bonding channel and leaves free the external contact pads in the edge region of the interposer substrate.

This semiconductor component has the advantage that it supports the trend for stacking individual semiconductor components in separate packages, so-called "package on package" (POP) technology, which has considerable advantages over components with stacked semiconductor chips, so-called multichip packages (MCP). The stacking of individual semiconductor components is associated with the advantage of an increased stack yield, since the individual stack elements can be tested prior to stacking. For memory components, in particular, it is possible to carry out a "burn-in" test prior to stacking. The component according to an embodiment also supports modularity. This is because the individual elements of the stack can be specified differently.

These advantages have an effect through to the end customer, who can now advantageously make a selection of the POP stack elements. In this case, individual POP semiconductor components may already constitute a stack. By way of example, a stack of DRAMs that may be offered to the customer as a prefabricated memory stack may thus be provided, by the customer, with a logic semiconductor component for driving. The semiconductor component according to an embodiment as specified above also overcomes the problem of stacking DRAM semiconductor components. These memory components, in contrast to conventional semiconductor components, have a semiconductor chip which does not have its contact areas in the edge region of the semiconductor chip, but rather has its contact areas arranged centrally often in two parallel contact area rows. The problem, specifically, consists in getting from the central contact areas to the external contact pads in the edge region on the interposer substrate. This is solved according to an embodiment by means of the interposer lines of the interposer structure which extend from the bonding channel to the external contact pads.

A further problem is the stability of such a stack element and the associated overall stability in conjunction with minimizing the thickness of the interposer substrate. The said stability is achieved according to an embodiment by means of a reinforcement of the side edges of the semiconductor chip, with the aid of a plastics composition. Moreover, the stability of the semiconductor component is supported by the fact that not only are the bonding connections of the bonding channel embedded in a plastics composition, but said covering also extends with the parts of the interposer structure on the interposer substrate whilst leaving free the external contact pads in the edge region of the interposer substrate. Consequently, both the underside and the top side of the interposer substrate of the semiconductor component are mechanically reinforced without increasing the space requirement.

For this purpose, in one embodiment, the diameter of the external contacts on the external contact pads is dimensioned such that it corresponds approximately to the sum of the thickness d of the semiconductor chip and the thickness a of the covering, or only slightly exceeds the sum of these two thicknesses.

$$(a+d) \leq D \leq 1.5(a+d)$$

Here D=diameter of the external contact; d=thickness of the covering on the interposer structure; a=thickness of the semiconductor chip.

In one embodiment, the external contact pads on the interposer substrate side on which the semiconductor chip is arranged have external contacts. Said external contacts surround the semiconductor chip and project beyond the semiconductor chip since their external diameter D is greater than the thickness d of the semiconductor chip.

This embodiment has the advantage that only the interposer structure with external contact pads, interposer lines and contact connection areas for the bonding connections in the bonding channel are arranged on the opposite side of the interposer substrate to the semiconductor chip. Consequently, said interposer structure can be adapted to any desired arrangement of external contacts of a semiconductor component to be stacked. For this purpose, only the external contact pads which are arranged on the edges of the interposer substrate in the case of a stack element now have to be adapted to the pattern or to the matrix of the external contacts of the semiconductor component to be stacked. Only the bonding channel with its plastic covering would have to be kept free of external contacts of a semiconductor component to be stacked on the interposer structure.

A further embodiment provides for the external contact pads on the interposer substrate side which is opposite to the semiconductor chip to have external contacts which, for their part, surround the covering of the interposer structure and project beyond the covering with their height. In order to ensure contact between said external contacts and the next semiconductor component in the stack of semiconductor components, the external contacts not only project beyond the covering in terms of their height, but project beyond the covering by at least the thickness of a semiconductor chip. Consequently, it is possible to stack one semiconductor component on the other without there being the risk of not achieving a connection to the superordinate or subordinate external contact pads when stacking a plurality of semiconductor components.

In one of the embodiments, the semiconductor chip is fixed with its active top side in relation to the interposer structure situated opposite to the semiconductor chip on the interposer substrate in such a way that the contact areas of the active top side of the semiconductor chip are ordered in the central bonding channel of the interposer substrate. For this purpose, the interposer structure may have interposer lines which, having a desired breaking location, extend over the bonding channel.

After the semiconductor chip has been fixed on the interposer substrate, the contact areas will be bonded whilst tearing away the desired breaking location. As an alternative, contact connection areas may be provided in the interposer structure all around the bonding channel, so that it is possible, after the fixing of the semiconductor chip, to bond to the interposer structure by means of bonding technology bonding wires from the contact areas of the semiconductor chip to the contact connection areas on the opposite side of the interposer structure.

In both cases the embodiments has the advantage over conventional components that not only are the bonding connections of the bonding channel embedded in a plastics composition, but the plastics composition can extend over the entire interposer structure whilst leaving free the external contact pads. This large-area bonding channel protection may be embodied by the design of the "molding body" such that not only does a higher strength occur for the semiconductor component, but flexure or "warpage" is also minimized.

It is furthermore provided that a plurality of semiconductor components are produced on a panel and delivered. For this purpose, the panel has semiconductor component positions arranged in rows and columns. Said semiconductor component positions are arranged on a metal-coated carrier substrate, such as a plastic film, for example. The semiconductor components arranged on the panel in this way correspond to the semiconductor component according to an embodiment as discussed above.

Provision is furthermore made for assembling a semiconductor module from the semiconductor components after successful functional testing and/or successful "burn-in" testing by stacking. For this purpose, the semiconductor module has, as a stacked semiconductor component, at least one of the semiconductor components discussed above as stack element. However, the semiconductor module may also be constructed from a plurality of the semiconductor components discussed above. In this case, the topmost stacked semiconductor component of the semiconductor module may have a covering made of plastics composition on the edge regions, too, so that the external contact pads situated there are additionally covered by said plastics composition. As a result, the overall stability of the semiconductor module is increased and a higher dimensional stability is achieved since now the edge regions of the interposer substrate side of the topmost semiconductor component are also covered with plastic.

In a further preferred embodiment of the semiconductor module, the rear sides of the semiconductor chip which are not covered with a plastics composition, in the semiconductor component stack, are arranged on the coverings made of plastics composition of the adjacent semiconductor component. The bearing of the rear side of the semiconductor chips on the coverings of the nearest adjacent semiconductor components simultaneously achieves an automatic limitation of the melting of the external contacts during the assembly of the semiconductor module. Moreover, this realizes the minimum space requirement.

In addition, in a further embodiment of the semiconductor module, the rear sides of the semiconductor chips in the semiconductor component stack may be provided with adhesion layers (such as adhesion layers 98 in FIG. 3). Said adhesion layers enable a cohesive connection between the rear sides of the semiconductor chips and the coverings made of plastics composition. Said adhesion layers can simultaneously cure and crosslink during the soldering-on of the external contacts on the respective external contact pads of adjacent semiconductor components. This embodiment has the advantage of further increasing the strength of the semiconductor module.

The uncovered rear side of a topmost semiconductor chip of the topmost semiconductor component of a semiconductor module may be covered by a heat sink (such as heat sink 80 as shown in FIG. 3). Such a heat sink may have a variety of forms. The body of the heat sink may be equipped with cooling fins and the material of the heat sink is preferably aluminum or an aluminum alloy. In order to increase the emission of heat, said heat sink may be blackened on its surface. The semiconductor module can thus be connected to a "heat spreader" for heat dissipation in a simple manner.

A method for producing a stack of semiconductor components may be effected in three stages. Firstly, a plurality of semiconductor components are produced on a panel, the components being arranged in rows and columns on the panel in semiconductor component positions. The panel may already be subjected to a variety of test methods. Afterward, in a second stage, the panel is separated into individual stackable semiconductor components. Said semiconductor components, for their part, are subjected to a wide variety of tests, including a "burn-in" test, before they are assembled to form a semiconductor module in a third stage.

A method for producing a panel comprising semiconductor component positions arranged in rows and columns for a plurality of stackable semiconductor components comprising an interposer substrate has the following method steps. Firstly, a metal-coated insulating carrier plate is provided. This is followed by the introduction of bonding channels in the center and through contacts in edge regions of the semiconductor component positions into the carrier substrate. Finally, the metal-coated underside is patterned to form external contact pads in the positions of the through contacts. Afterward, the top side of the carrier substrate may be patterned to form an interposer structure with external contact pads situated opposite the external contact pads of the underside in the positions of the through contacts. Interposer lines to contact connection areas in the region of the central bonding channel are realized at the same time as this patterning. Semiconductor chips are then applied to the interposer substrate in the semiconductor component positions with the production of electrical connections between the interposer structure and the semiconductor chip.

Afterward, a plastics composition as covering of the interposer structure and for covering the side edges of the semiconductor chips is applied to the panel. Finally, it is also possible to position onto the panel external contacts on the corresponding external contact pads on one of the sides of the interposer substrate. Depending on whether said external contacts are fitted on the interposer side on which the semiconductor chip is situated or on the interposer side on which the interposer structure is situated, this is called a "face-up" orientation or a "face-down" orientation.

The production of the semiconductor components in semiconductor component positions of a panel has the advantage that the majority of the production steps can be effected simultaneously in parallel for all the components. Thus, the introduction of bonding channels may be effected by means of stamping simultaneously for all the semiconductor components of a panel. With the process of stamping out the bonding channels it is also possible to prepare passage holes for the later through contacts. A different technology for introducing the bonding channels is applied if interposer lines with desired breaking locations are intended to extend over said bonding channels. Stamping-out is not appropriate in this case, rather a suitable structure can be realized by laser removal or by resolving the carrier plate in the region of the bonding channels.

The patterning of the metal-coated surfaces on the underside and/or top side of the carrier substrate may be effected by means of photolithography technology, printing jet technology, stencil printing technology or screen printing technology. These technologies merely involve producing a protective mask for the metal structures that are intended to remain on the top sides and/or on the undersides. The actual patterning may then be effected by means of technologies for etching or technologies for plasma etching of the unprotected metal layer regions. While photolithography technology, stencil printing technology or screen printing technology can apply a structure in parallel and over a large area, printing jet technology creates the structure of the protective mask serially in a similar manner to application by means of an inkjet printer.

The application of the semiconductor chips to the interposer substrate may be effected by means of adhesive-bonding technology or soldering technology, thereby giving rise in both cases to a cohesive connection between the interposer substrate and the semiconductor chip. For this purpose, the semiconductor chip is aligned with the bonding channel in each of the semiconductor positions of the panel.

The subsequent production of electrical connections between the contact areas of the top side of the semiconductor chip and contact connection areas on the interposer substrate in the region of the bonding channel may be effected by means of bonding wire technology. In that case, bonding wire connections between the contact areas of the semiconductor chip and the contact connection areas are produced by means of two bonding locations per connection. In the other case, in which the bonding channel is spanned by interposer lines, only one bonding location may be required on the contact areas of the semiconductor chip with the interposer lines being torn away at their desired breaking locations.

The covering, both of the interposer structure and of the side edges of the semiconductor chip, may be effected by printing, dispensing or injection molding, also called "molding". In this case, preference is given to the "molding" method for throughput reasons. This is because both the semiconductor chip edge protection by coating the side edges of the semiconductor chip and the covering of the interposer structure can be effected simultaneously with the filling of the bonding channel during the "molding" method. The other methods, by contrast, are serial methods requiring a corresponding expenditure of time, with the result that the throughput is correspondingly reduced.

After covering with the aid of a plastics composition, the external contacts can be applied to the external contact pads of each of the semiconductor component positions of the panel before the panel is then divided into individual stackable semiconductor components. These stackable semiconductor components can be tested individually after the separation of the panel, thereby reducing the reject rate during assembly to form a stacked semiconductor module.

For the production of a semiconductor module, a base component is provided, on which the stackable semiconductor components according to an embodiment can be stacked. Said base component may already be one of the stackable semiconductor components according to an embodiment. However, a semiconductor component specified by the customer may also be used as the base component. The stackable semiconductor components discussed above may then be applied to this base component provided. In this case, the topmost semiconductor component may differ from the rest of the stackable semiconductor components by virtue of the fitting of a heat sink or by virtue of a fitting of an additional covering with plastics composition. Moreover, it is possible, by using a topmost semiconductor component with "face-up" orientation, to provide the interposer structure then situated at the top for a stackable customized further semiconductor component.

To summarize, it can be stated that the stacking of individual packages can be facilitated and, as a result, may enable a very compact and thin stack of memory components. Consequently, a thin, individually pluggable DRAM elements for a POP technology can be enabled. For this purpose, the DRAM semiconductor chip is mounted either in "face-down" orientation or "face-up" orientation on a thin interposer substrate with copper layers patterned on one or two sides. The centrally arranged bonding channel is protected by a protective material that may be applied by printing, dispensing or by injection molding or molding.

Since the edges of the silicon semiconductor chip are particularly susceptible to mechanical stress as a result of their material brittleness, an edge protection is provided by coating the side edges of the semiconductor chip with a plastics composition. This edge protection may also be applied by printing, dispensing or by injection molding. Owing to the high throughput, the accuracy and the reproducibility of the results, the injection-molding method is preferably used, especially as the edge protection and the protection of the bonding channel can be produced simultaneously by means of injection molding.

The mechanical loading of the semiconductor chip is high during the assembly of the package and during the test phases. Furthermore, mechanical damage may occur during the mounting of the semiconductor modules, in particular, when in the possession of the end customer, in the course of module repair or in the course of a module exchange. Consequently, the protection of the brittle and pointed side edges and edges of the silicon semiconductor chip that are at risk of fracturing by means of a protective ring being injection-molded all around the semiconductor chip is particularly advantageous.

Furthermore, the protection of the side edges of the semiconductor chip simultaneously brings about a stiffening of the interposer substrate region, thereby facilitating handling during the mounting steps for producing a semiconductor module and during testing. The risk of fracturing is thus likewise reduced. The construction of the semiconductor component can be advantageously implemented by the design of the bonding channel protection and the design of the semiconductor edge protection, or the arrangement of plastics composition, at the side edges of the semiconductor chip such that in addition to a higher strength, warpage of the interposer substrate is also minimized.

The rear side of the silicon semiconductor chip in a "face-down" orientation preferably remains free of plastic and without a covering in order to facilitate the fitting of a heat dissipation in the form of a "heat spreader". Such a thin DRAM element can then be used for the POP stack technology. In this case, the variant in which two individually stackable elements are stacked one on top of another, and a doubling of the storage density is thus achieved, can be a preferred variant.

With the stack component according to an embodiment, firstly, an increase in the mechanical strength is achieved by means of the edge protection for DRAM chips and, secondly, a minimized flexure of the interposer substrate of the semiconductor component is achieved by means of edge protection and bonding channel protection which can be produced in a single step.

FIG. 1 shows a schematic cross section through a semiconductor component 10, in accordance with a first embodiment. The semiconductor component 10 is based on an interposer substrate 1 having a thickness w, which lies between 50 µm and 250 µm and preferably has a thickness of 160 µm. The interposer substrate 1 has an interposer structure 3 on its underside 2, said interposer structure having been formed by patterning of a copper layer. The interposer structure 3 on the underside 2 of the interposer substrate 1 has external contact pads 7 and contact connection areas 23. Interposer lines 9 extend between external contact pads 7 arranged in edge regions 11 of the interposer substrate 1 and the contact connection areas 23 formed in the region of a bonding channel 18 and electrically connect the contact connection areas 23 to the external contact pads 7.

The bonding channel 18 is formed by a passage opening through the interposer substrate 1 in the center of the interposer substrate 1. The bonding channel 18 is elongated and has one, for example two rows of contact connection areas 23 of the underside 2 of the interposer substrate 1. These two rows of contact connection areas 23 are connected to contact areas 16 on the active top side 15 of a semiconductor chip 6 via bonding wires 27. The semiconductor chip 6 is arranged on the top side 4 of the interposer substrate 1. The semiconductor chip 6 is protected by a covering 24 made of plastics composition 12 on its side edges 22 against mechanical damage which may occur particularly during the later assembly of this semiconductor component 10 to form a stack or during the individual testing of the semiconductor component 10 or during the mounting of the module 19 on a superordinate printed circuit board or else in the possession of the end customer.

The ring made of a plastics composition 12 all around the semiconductor chip 6 leaves external contact pads 7 free on the top side 4 of the interposer substrate 1 in the edge region 11, which external contact pads thus remain freely accessible for test purposes and for stacking purposes. The external contact pads 7 on the underside 2 and on the top side 4 of the interposer substrate 1 are electrically connected to one another via through contacts 8. The semiconductor chip 6 is fixed on the top side 4 of the interposer substrate 1 by means of an adhesive layer 31, so that a displacement of the semiconductor chip 6 does not occur during the bonding of the bonding connections 17 and during the injection molding of the plastics composition 12. In this embodiment, the thickness d of the semiconductor chip 6 is between 70 and 200 μm, preferably 100 μm.

The thickness w of the interposer substrate 1 lies within the range of 50 to 250 μm, and is preferably 160 μm in this embodiment of the figure, the interposer substrate 1 being constructed in three layers and having an electrically insulating carrier substrate 19 provided with patterned metal layers on both sides.

The bonding channel 18 is protected by a plastics composition 12 which is extended to form a covering 24. Said covering 24 not only covers the bonding channel 18, and embeds the bonding connection 17 in plastics composition 12, but also partly covers the interposer structure 3 on the underside 2 of the interposer substrate 1. Suitable coordination of the areal extent of the covering 24 and the annular formation of the plastics composition 12 at the side edges 22 of the semiconductor chip 6 simultaneously ensures that warpage of the interposer substrate 1 does not occur during and after injection molding.

The thickness a of the covering 24 over the interposer structure 3 is between 70 and 150 μm, preferably 100 μm. This results in a range of between 190 and 600 μm for the total height h or the total thickness h of the semiconductor component 10, and the thickness h is preferably 250 μm. Said thickness h relates to a possible minimum stack height if the semiconductor component 10 is used as a stack element of a semiconductor component stack. Therefore, said thickness h does not take account of the height of the external contacts 5. The external contacts 5 of the first embodiment are arranged opposite to the semiconductor chip 6 on the external contact pads 7 of the underside 2 of the interposer substrate 1 in the edge regions 11. Given a preferred total thickness h of 250 μm, the height of the external contacts should not be less than 150 μm.

In this first embodiment, the external contacts 5 are realized by solder balls 32, which have a solder alloy and thus have the advantage during stacking that they can be soldered onto the underlying external contact pads 7 of the nearest neighbor in the stack. Consequently, in this embodiment, the diameter D of the solder balls 32 is preferably approximately 200 μm, it being provided that approximately 25 μm of the solder ball height may be required during each operation of soldering onto external contact pads 7, in order to ensure a reliable electrical transition. In that case, the covering 24 then lies on the rear side 14 of the respective underlying semiconductor chip 6 in a semiconductor component stack 25.

Even before the application of the external contacts 5, each of the semiconductor components 10 can be tested with regard to its functionality and a check with regard to thermal stability can also be carried out. For testing the thermal stability, the semiconductor component 10 is subjected to a multiple temperature cycle of −50 to +150° C. in a "burn-in" test. This ensures that for a semiconductor module comprising stacked semiconductor components 10, only functional semiconductor components 10 are connected to one another via their external contacts 5.

FIG. 2 shows a schematic cross section through a semiconductor component 10, in accordance with a second embodiment. Components having functions identical to those in the previous figures are identified by the same reference symbols and are not discussed separately.

Whereas in the first embodiment a semiconductor chip 6 in a "face-down" orientation is mounted and fixed on the interposer substrate 1, in the second embodiment the semiconductor chip 6 is arranged in a so-called "face-up" orientation. For this purpose, the external contacts 5 are arranged on the same side as the semiconductor chip 6 in the second embodiment. Consequently, the semiconductor chip 6 is situated on the underside 2 of the interposer substrate 1 in the same way as the external contacts 5 are fitted on the external contact pads 7 of the underside 2 of the interposer substrate 1. By contrast, the interposer structure 3 is now arranged on the top side 4 of the interposer substrate 1 and the covering 24 is likewise positioned on said top side 4.

FIG. 3 shows a schematic cross section of three DRAMs 33, 34 and 35 aligned with one another. In this case, the middle DRAM 34 corresponds to the semiconductor component 10 in accordance with the first embodiment and has the semiconductor chip 6 in its "face-down" orientation. Components having functions identical to those in FIG. 1 are identified by the same reference symbols and are not discussed separately. The lower DRAM 33 is virtually identical to the semiconductor component of the first embodiment, but the covering 24 made of plastics composition 12 is not just arranged partly over the interposer structure 3, but rather completely covers the interposer structure 3 and thus gives the base component 26 or the bottom most semiconductor component a higher dimensional stability. This enlarged form of covering can also be chosen for the stacked semiconductor components, thereby increasing the overall stability of the semiconductor chip stack.

The topmost DRAM 35 likewise has slight deviations from the semiconductor component 10 shown in FIG. 1, in which case, firstly, this topmost semiconductor component 29 may no longer require through contacts which, in the case of the DRAMs 33 and 34, connect the external contact pads 7 on the underside 2 of the interposer substrate 1 to the external contact pads 7 on the top side 4 of the interposer substrate 1. The external contact pads are equally absent on the top side 4 of the interposer substrate 1 of the topmost semiconductor component 29. As previously described, the uncovered rear side of the topmost semiconductor chip 6 of the topmost DRAM 35 may be covered by heat sink 80. Furthermore, the protective ring made of plastics composition 12 all around the side edges 22 of the semiconductor chip 6 of the topmost semiconductor component 29 is larger and now extends as far as the side edge of the interposer substrate 1, this being associated with an improved mechanical protection. However, the topmost semiconductor component may also be embodied identically to the stacked semiconductor components.

In order to combine these three DRAMs 33, 34 and 35 to form a compact semiconductor component stack, the DRAMs 33 to 35 are positioned one on top of another in arrow direction A. In a soldering furnace, the external contacts 5 are cohesively connected to the external contact pads 7—arranged underneath—of the nearest neighbor in the stack.

FIG. 4 shows a schematic cross section through a memory module comprising three semiconductor components 10, 26 and 29, as are shown in FIG. 3, which are stacked one on top of another. Components having functions identical to those in FIGS. 1 and 3 are identified by the same reference symbols and are not discussed separately. During the soldering operation mentioned above, the solder balls 32 used as external contacts 5 are melted in such a way that the coverings 24 bear on the rear sides 14 of the semiconductor chips 6 of the underlying semiconductor components. This is associated with the advantage that a soldering stop is defined during stacking, with the result that a melting of the solder balls is automatically limited and stopped. Moreover, it is possible to reduce thermal stresses as a result of sliding displacements as long as no adhesion effect occurs.

The compactness of such a semiconductor module 30 comprising a semiconductor component stack 25 can be improved further if an adhesive layer cohesively connects the coverings 24 to the underlying rear sides 14 of the semiconductor chips 6. In principle, it is also possible for three completely identical semiconductor components 10 in accordance with the first embodiment to be assembled to form a semiconductor component stack 25 of this type. Applying two semiconductor components 10 of this type one on top of another would already double the storage capacitance of a memory module of this type.

Figure 5:
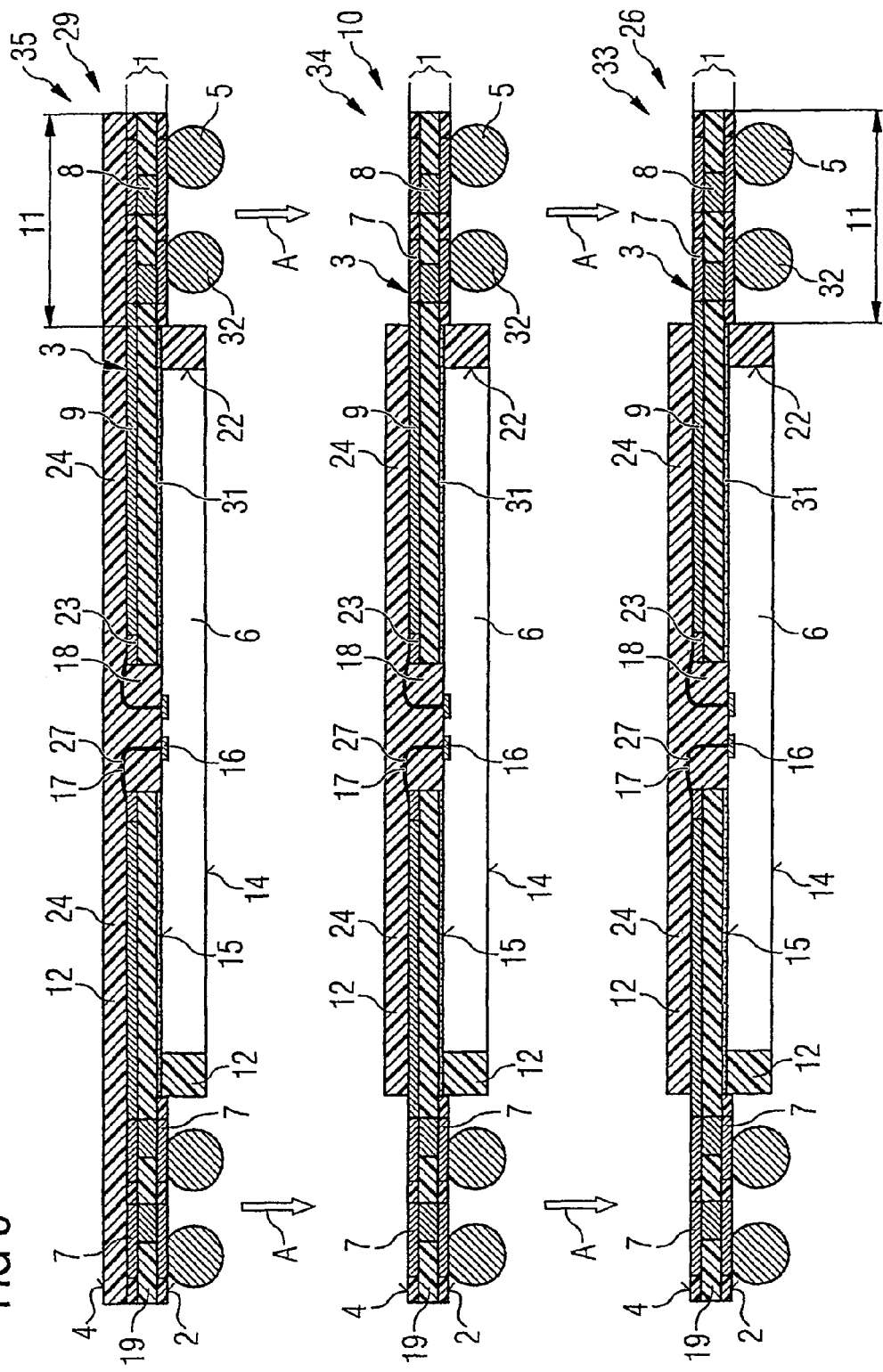
FIG. 5 shows a schematic cross section of three DRAMs aligned with one another, in accordance with the second embodiment.
Figure 6:
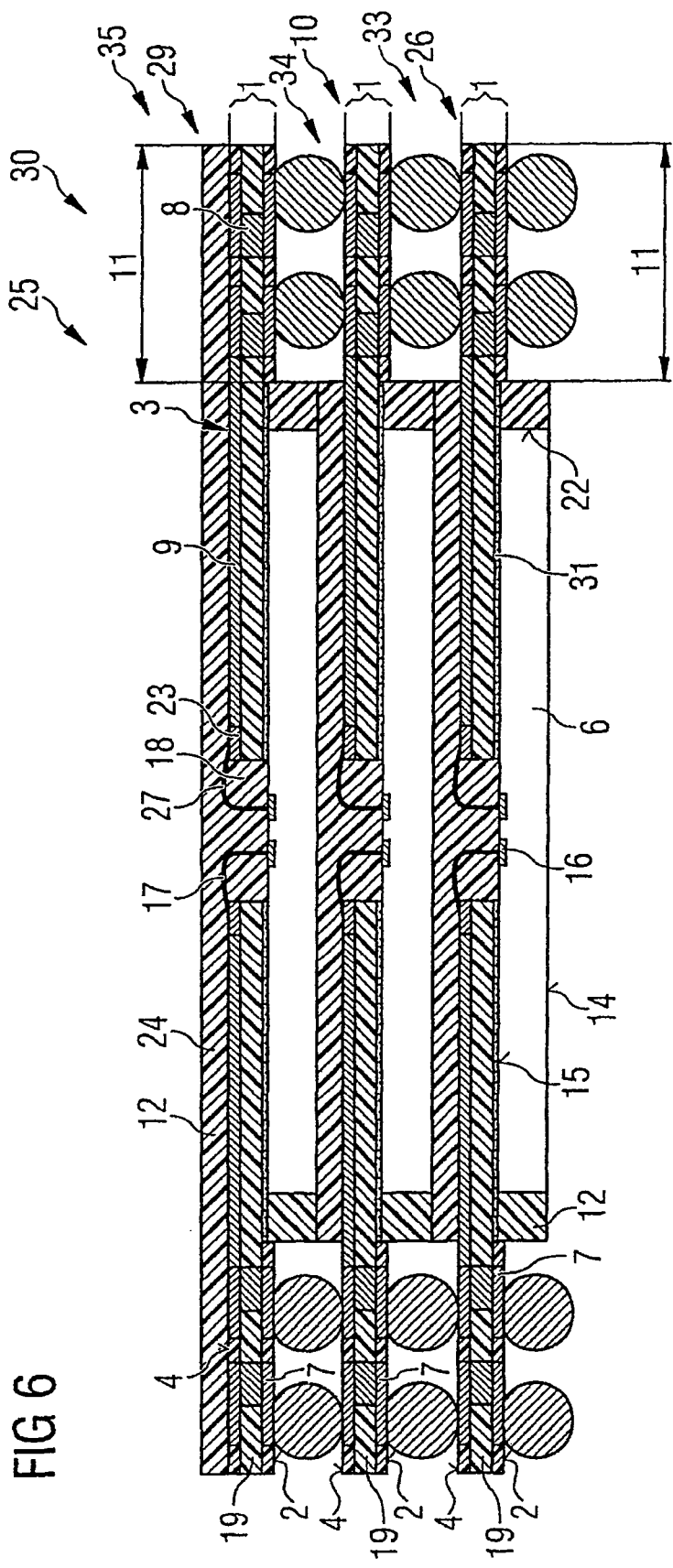
FIG. 6 shows a schematic cross section through a memory module comprising three semiconductor components stacked one on top of another, in accordance with the second embodiment.

FIG. 5 shows a schematic cross section of three DRAMs 33, 34 and 35 aligned with one another, in accordance with the second embodiment. The bottom most DRAM 33 and the DRAM 34 arranged above it are identical and correspond to the second embodiment. By contrast, the topmost DRAM 35 has no external contact pads 7 on the top side 4 of the interposer substrate 1 and the covering 24 extends as far as the edge sides 11 of the interposer substrate 1. These three DRAMs 33, 34 and 35 can be stacked one on top of another in direction A, after corresponding alignment. FIG. 6 shows the result of this stacking.

FIG. 6 shows a schematic cross section through a memory module comprising three semiconductor components 10, 26 and 29 stacked one on top of another. The semiconductor chips 6 of this stack are arranged in the so-called "face-up" orientation and their edges are protected against damage by means of a plastic ring made of plastics composition 12. The covering 24 made of plastics composition on the top side 4 of the interposer substrate 1, the opposite side to the semiconductor chip 6, almost completely covers the interposer structure 3. The topmost semiconductor component 29, or the topmost DRAM 35, has a closed covering 24 which covers the entire interposer substrate 1. The semiconductor component stack 25 is thereby protected against mechanical damage in the edge region 11 as well. While FIGS. 4 and 6 show semiconductor component stacks showing a base component 26 in the form of a DRAM 33 of one embodiment, base components which are based on flip-chip technology are used in the next two FIGS. 7 and 8. The chip sizes within the stack and the semiconductor chip size of the base component need not be identical and may differ from one another.

Figure 7:
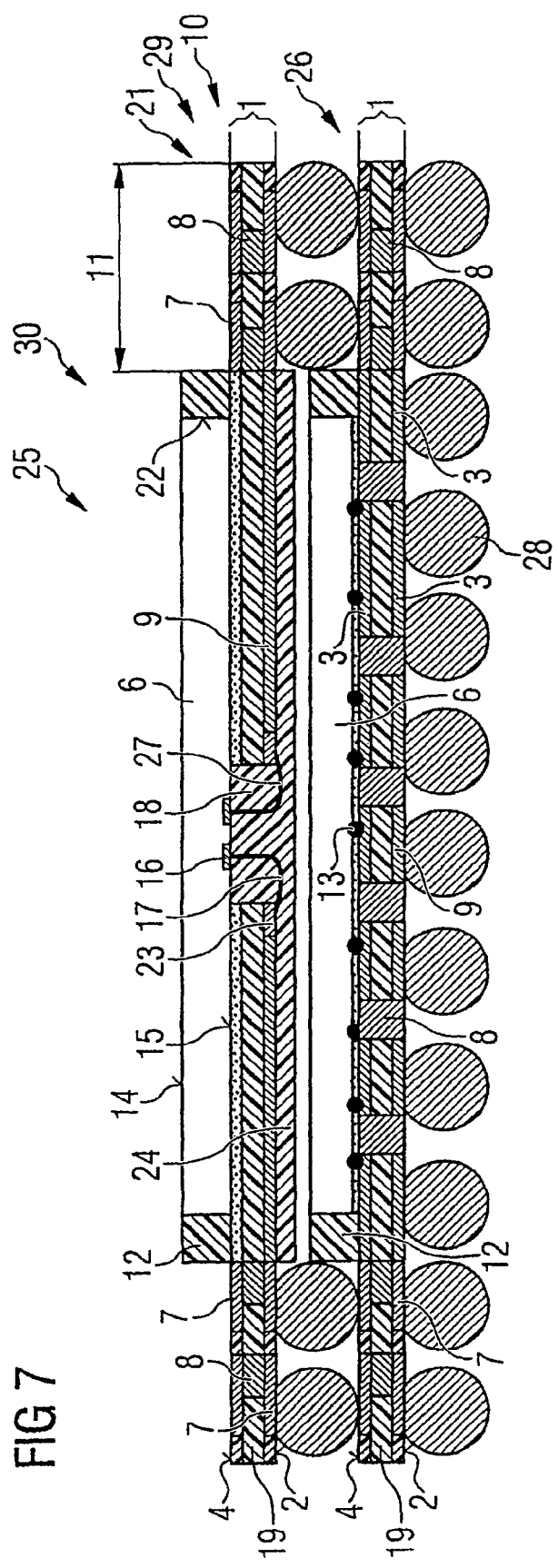
FIG. 7 shows a schematic cross section through a memory module comprising a base semiconductor component using flip-chip technology and a stacked semiconductor component, in accordance with the first embodiment.

FIG. 7 shows a schematic cross section through a memory module comprising a base component 26 using flip-chip technology and a stacked semiconductor component 21, in accordance with the first embodiment. Components having functions identical to those in the previous figures are identified by the same reference symbols and are not discussed separately.

The base component 26 has an interposer substrate 1 which rests on external contacts 28 distributed uniformly on the underside 2. This arrangement of the external contacts 28 on the underside 2 additionally stabilizes the semiconductor module 30 and imparts a higher dimensional stability to it. In this case, in FIG. 7, the semiconductor chip 6 was arranged in "face-down" orientation in the topmost semiconductor component 29 and the external contact pads 7 situated on the edge sides 11 were kept free of plastics composition 12. This affords the possibility of further supplementing the stack comprising two semiconductor components 26 and 10 which is shown in FIG. 7, as is shown in FIG. 8.

Figure 8:
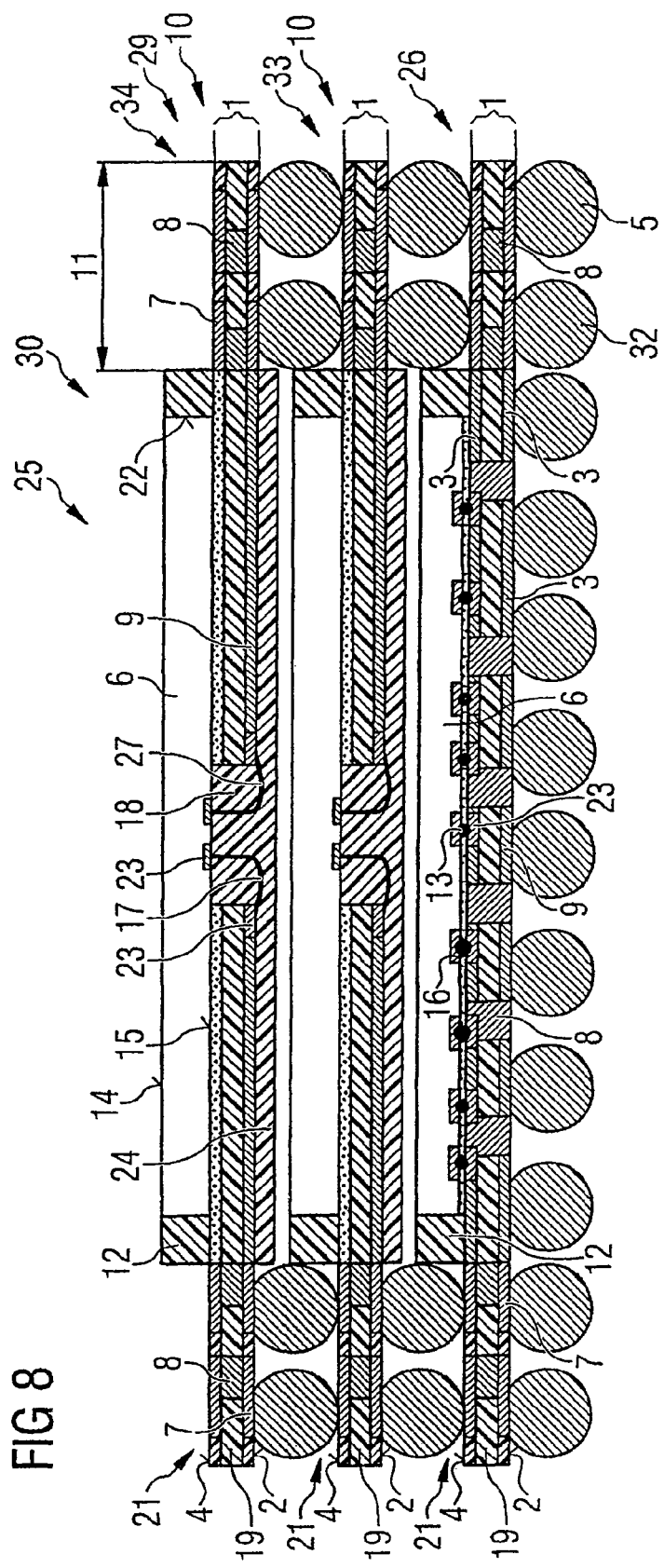
FIG. 8 shows a schematic cross section through a memory module comprising a base semiconductor component using flip-chip technology and two semiconductor components stacked thereon, in accordance with the first embodiment.

FIG. 8 shows a schematic cross section through a memory module comprising a base component 26 using flip-chip technology and two semiconductor components 21 stacked thereon in accordance with the first embodiment. As a result of stacking two DRAMs 33 and 34 on the base component 26 using flip-chip technology, the storage capacity of this semiconductor module 30 is doubled compared with the stack in FIG. 7. Components having functions identical to those in the previous figures are identified by the same reference symbols and are not discussed separately. The base component 26 has a semiconductor chip 6, on whose contact areas 16 of its active top side 15 flip-chip contacts 13 are arranged directly. Said flip-chip contacts 13 are connected via an interposer structure 3 with interposer lines 23 and through contacts 8 to an interposer structure 3 on the underside 2 of the base component 26. The interposer structure 3 on the underside has external contact areas 7 with external contacts 28 which are distributed uniformly on the underside.

Such a semiconductor component 26 using flip-chip technology may have a logic chip, for example, which controls the DRAMs 33 and 34 arranged above it as memory components and reads in their data for storage and outputs their data for evaluation. Finally, the external contacts 28 distributed uniformly on the underside 2 of the interposer substrate 1 of the base component 26 contribute to the stability of the semiconductor module 30.

What is claimed is:

1. A semiconductor component, comprising:
    an interposer substrate as a stack element of a semiconductor component stack, the interposer substrate having a first side and an opposite second side, wherein external contact pads are arranged in edge regions of the first side of the interposer substrate, and wherein a DRAM semiconductor chip is arranged on the second side of the interposer substrate;
    contact areas on an active top side of the semiconductor chip electrically connected via a bonding channel in the interposer substrate to an interposer structure on the first side of the interposer substrate, the interposer structure having interposer lines extending from the bonding channel to the external contact pads;

a first covering made of plastics composition disposed on the first side of the interposer substrate so as to cover an entirety of the first side of the interposer substrate except for the external contact pads; and a second covering made of plastics composition disposed on the second side of the interposer substrate so as to cover side faces of the semiconductor chip and to extend from the side faces to side edges of the interposer substrate, but not to cover a rear side of the semiconductor chip opposite the active top side, wherein the second covering is disposed on locations of the second side of the interposer substrate that are directly opposite each of the external contact pads, and wherein the external contact pads are not covered by the second covering on the first side of the interposer substrate.

2. A semiconductor component according to claim 1, wherein the semiconductor chip is fixed with its active top side on the interposer structure in such a way that the contact areas of the active top side of the semiconductor chip are arranged in the bonding channel of the interposer substrate.

3. A semiconductor component according to claim 1, wherein the bonding channel in the interposer substrate has bonding connections between the contact areas of the active top side of the semiconductor chip and the interposer lines of the interposer structure of the interposer substrate.

4. The semiconductor component of claim 1, wherein the external contact pads on the interposer substrate side opposite the semiconductor chip have external contacts that surround the second covering and project beyond the second covering, wherein $(a+d) \leq D \leq 1.5(a+d)$, and wherein "D" is a diameter of each of the external contacts, "d" is a thickness of the semiconductor chip, and "a" is a thickness of the covering.

5. A semiconductor module, comprising:

a first DRAM semiconductor component, comprising:

a first interposer substrate having a first side and an opposite second side, wherein a first pair of mutually opposite external contact pads are arranged in edge regions of the first and second sides of the first interposer substrate, wherein the first pair of external contact pads are electrically connected via first through contacts through the first interposer substrate, and wherein a first semiconductor chip is arranged on the second side of the first interposer substrate, the first semiconductor chip not extending into the edge regions of the first interposer substrate, and a first set of contact areas on an active top side of the first semiconductor chip electrically connected via a first bonding channel in the interposer substrate to a first interposer structure on the first side of the first interposer substrate, the first interposer structure having a first set of interposer lines having a first end disposed at an edge of the first bonding channel and continuously extending to a second end disposed at the first pair of external contact pads, a first covering made of plastics composition disposed on the first side of the first interposer substrate so as to cover the entire first interposer structure but not any of the first pair of external contact pads, and further disposed on the second side of the first interposer substrate so as to cover side edges of the first semiconductor chip but not a rear side of the first semiconductor chip opposite its active top side and not any of the first pair of external contact pads, the first covering exposing the edge regions of the first interposer substrate; and a second DRAM semiconductor component, comprising:

a second interposer substrate having a first side and an opposite second side, and comprising external contact pads arranged in edge regions of the first side of the second interposer substrate, wherein a second semiconductor chip is arranged on the second side of the second interposer substrate; and a second set of contact areas on an active top side of the second semiconductor chip electrically connected via a second bonding channel in the second interposer substrate to a second interposer structure on the first side of the second interposer substrate, the second interposer structure having a second set of interposer lines having a first end disposed at an edge of the second bonding channel and continuously extending to a second end disposed at the external contact pads of the second interposer substrate, and a second covering made of plastics composition disposed on the second side of the second interposer substrate so as to cover side faces of the second semiconductor chip and to extend continuously from a first end disposed at the side faces to a second end disposed at side edges of the second interposer substrate, but not to cover a rear side of the second semiconductor chip opposite the active top side.

6. A semiconductor module according to claim 5, wherein the first and second DRAM semiconductor components are stacked as a semiconductor component stack.

7. A semiconductor module according to claim 6, wherein the first and second DRAM semiconductor components are arranged such that the first side of the first interposer substrate and the first side of the second interposer substrate are facing in a same direction.

8. A semiconductor module according to claim 5, further comprising an adhesion layer connecting the rear side of the first semiconductor chip with the second covering on the first side of the second interposer substrate.

9. A semiconductor module according to claim 5, further comprising a heat sink arranged on the rear side of the first semiconductor chip.

10. The semiconductor module of claim 5, wherein the first and second semiconductor chips are identical.

11. The semiconductor module of claim 5, wherein the external contact pads on the first side of the first interposer substrate are electrically connected to external contacts that project beyond the first covering, wherein $(a+d) \leq D \leq 1.5(a+d)$, and wherein "D" is a diameter of each of the external contacts of the first interposer substrate, "d" is a thickness of the first semiconductor chip, and "a" is a thickness of the first covering.

12. The semiconductor module of claim 5, wherein the external contact pads on the first side of the second interposer substrate are electrically connected to external contacts that project beyond the second covering, wherein $(a+d) \leq D \leq 1.5(a+d)$, and wherein "D" is a diameter of each of the external contacts of the second interposer substrate, "d" is a thickness of the second semiconductor chip, and "a" is a thickness of the second covering.

13. A semiconductor component, comprising:

a first substrate having a first side and an opposite second side;

a first plurality of contact pads disposed on the first side of the first substrate;

a first DRAM semiconductor chip disposed on the second side of the first substrate, the first semiconductor chip having a first side facing the first substrate, a second side opposite the first side, and third and fourth sides facing in directions different from the first and second sides of the first semiconductor chip, a first plurality of contact areas disposed on the first side of the first semiconductor chip and electrically connected via a first channel in the first substrate to the first plurality of contact pads; and an electrically insulating first covering disposed on the second side of the first substrate so as to cover the third and fourth sides of the first semiconductor chip and to extend from the third and fourth sides to edges of the first substrate, but not to cover the second side of the first semiconductor chip, the first covering being further disposed on the first side of the first substrate so as to cover an entirety of the first side of the first substrate except for the first plurality of contact pads, wherein the first covering is disposed on locations of the second side of the first substrate that are directly opposite each of the first plurality of contact pads, and wherein the first plurality of contact pads are not covered by the first covering on the first side of the interposer substrate.

14. The semiconductor component of claim 13, further comprising:
a second substrate having a first side and an opposite second side;
a second plurality of contact pads arranged in pairs that are disposed on both the first and second sides of the second substrate;
a second DRAM semiconductor chip disposed on the second side of the second substrate, the second semiconductor chip having a first side facing the second substrate, a second side opposite the first side of the second semiconductor chip, and third and fourth sides facing in directions different from the first and second sides of the second semiconductor chip, a second plurality of contact areas disposed on the first side of the second semiconductor chip and electrically connected via a second channel in the second substrate to the second plurality of contact pads, and
an electrically insulating second covering disposed on the second side of the second substrate so as to cover the third and fourth sides of the second semiconductor chip, but not to cover the second side of the second semiconductor chip and any of the second plurality of contact pads, the second covering being further disposed on the first side of the second substrate so as to cover the entire second channel but not any of the second plurality of contact pads.

15. The semiconductor module of claim 14, wherein the first and second substrates are stacked with respect to each other such that the first side of the first substrate faces in a same direction as the first side of the second substrate.

16. The semiconductor module of claim 14, further comprising:
a third substrate having a first side and an opposite second side;
a third plurality of contact pads arranged in pairs that are disposed on both the first and second sides of the third substrate;
a third DRAM semiconductor chip disposed on the second side of the third substrate, the third semiconductor chip having a first side facing the third substrate, a second side opposite the first side of the third semiconductor chip, and third and fourth sides facing in directions different from the first and second sides of the third semiconductor chip, a third plurality of contact areas disposed on the first side of the third semiconductor chip and electrically connected via a third channel in the third substrate to the third plurality of contact pads, and
an electrically insulating third covering disposed on the second side of the third substrate so as to cover the third and fourth sides of the third semiconductor chip, but not to cover the second side of the third semiconductor chip and any of the third plurality of contact pads, the third covering being further disposed on the first side of the third substrate so as to cover the entire third channel but not any of the third plurality of contact pads.

17. The semiconductor module of claim 16, wherein the first, second, and third substrates are stacked with respect to each other such that the first side of the first substrate, the first side of the second substrate, and the first side of the third substrate all face in a same direction.

18. The semiconductor module of claim 13, wherein the contact pads on the first side of the first substrate are electrically connected to contacts that project beyond the first covering, wherein $(a+d) \leq D \leq 1.5\,(a+d)$, and wherein "D" is a diameter of each of the contacts of the first interposer substrate, "d" is a thickness of the first semiconductor chip, and "a" is a thickness of the first covering.

19. The semiconductor module of claim 13, wherein the first and second semiconductor chips are identical.

* * * * *